United States Patent
Behm et al.

(10) Patent No.: US 8,590,705 B2
(45) Date of Patent: Nov. 26, 2013

(54) CYLINDER SURFACE TREATED CONTAINER FOR MONOCHLOROSILANE

(75) Inventors: Philip E. Behm, Auburn, PA (US); Wayne Thomas McDermott, Fogelsville, PA (US); Manchao Xiao, San Diego, CA (US); Ronald Martin Pearlstein, San Marcos, CA (US); Sai-Hong A. Lo, Allentown, PA (US); Agnes Derecskei-Kovacs, Gambrills, MD (US)

(73) Assignee: Air Products and Chemicals, Inc., Allentown, PA (US)

( * ) Notice: Subject to any disclaimer, the term of this patent is extended or adjusted under 35 U.S.C. 154(b) by 48 days.

(21) Appl. No.: 13/090,346

(22) Filed: Apr. 20, 2011

(65) Prior Publication Data
US 2012/0103857 A1    May 3, 2012

Related U.S. Application Data

(60) Provisional application No. 61/353,870, filed on Jun. 11, 2010.

(51) Int. Cl.
*B65D 81/02* (2006.01)
*B24B 1/00* (2006.01)

(52) U.S. Cl.
USPC .......................... 206/524.3; 451/28

(58) Field of Classification Search
USPC ............ 206/524.1–524.5; 451/28, 29–36; 205/668; 427/230
See application file for complete search history.

(56) References Cited

U.S. PATENT DOCUMENTS

| | | | |
|---|---|---|---|
| 2,504,482 A * | 4/1950 | Goldman | 206/524.3 |
| 2,900,225 A | 8/1959 | Clasen | |
| 3,968,199 A | 7/1976 | Bakay | |
| 5,009,963 A | 4/1991 | Ohmi et al. | |
| 5,259,935 A | 11/1993 | Davidson et al. | |
| 5,479,727 A | 1/1996 | Fine et al. | |
| 5,480,677 A | 1/1996 | Li et al. | |
| 5,803,795 A | 9/1998 | Nozawa | |
| 6,029,717 A * | 2/2000 | Siegele et al. | 141/198 |
| 6,263,904 B1 | 7/2001 | Zdunek et al. | |
| 6,290,088 B1 | 9/2001 | Zdunek et al. | |

(Continued)

FOREIGN PATENT DOCUMENTS

| | | |
|---|---|---|
| JP | 06-239610 | 8/1994 |
| JP | 09-026093 | 1/1997 |

(Continued)

OTHER PUBLICATIONS

Sorokin, F. A., Effect of the abrasive treatment of gas cylinders on the stability of the composition of gas mixtures, Kislorodnaya Promyshlennost, 1978, vol. 4, pp. 14-18.

(Continued)

*Primary Examiner* — Bryon Gehman
(74) *Attorney, Agent, or Firm* — Rosaleen P. Morris-Osaknian; Joseph D. Rossi

(57) ABSTRACT

The present invention is a container and a processing for passivating the internal surface of the container to store monochlorosilane in a stable manner without degradation of the monochlorosilane. Various container surface modifications have been identified to reduce surface reactions to acceptable levels. Some of the described surface modifications result in significant reduction in monochlorosilane instability.

15 Claims, 1 Drawing Sheet

(56) References Cited

U.S. PATENT DOCUMENTS

| | | | |
|---|---|---|---|
| 6,365,227 B2 | 4/2002 | Zdunek et al. | |
| 6,511,760 B1 | 1/2003 | Barone et al. | |
| 7,021,487 B2 | 4/2006 | Kikkawa et al. | |
| 7,032,768 B2 | 4/2006 | Felbaum | |
| 7,448,402 B2 * | 11/2008 | Martrich et al. | 220/724 |
| 7,604,841 B2 * | 10/2009 | Joe et al. | 427/255.31 |
| 7,691,337 B2 * | 4/2010 | Bindelle et al. | 220/592 |
| 2001/0017300 A1 | 8/2001 | Zdunek et al. | |
| 2003/0068434 A1 | 4/2003 | Moore | |
| 2003/0189053 A1 | 10/2003 | Felbaum | |
| 2004/0026417 A1 | 2/2004 | Kikkawa et al. | |
| 2008/0018004 A1 | 1/2008 | Steidl et al. | |
| 2008/0099933 A1 | 5/2008 | Choi et al. | |
| 2010/0038362 A1 * | 2/2010 | Sasaki et al. | 206/524.5 |
| 2010/0140175 A1 | 6/2010 | Wyse et al. | |
| 2010/0270296 A1 * | 10/2010 | Rauleder et al. | 206/524.1 |

FOREIGN PATENT DOCUMENTS

| | | | |
|---|---|---|---|
| JP | 9165204 | A2 | 6/1997 |
| JP | 9302489 | A2 | 11/1997 |
| JP | 63019499 | A2 | 1/1998 |
| JP | 3116038 | B2 | 12/2000 |
| JP | 2005090651 | | 4/2005 |
| KR | 20100050891 | A | 5/2010 |
| WO | 2009034336 | A1 | 3/2009 |
| WO | 2009/053134 | A1 | 4/2009 |
| WO | 2010/053878 | A2 | 5/2010 |

OTHER PUBLICATIONS

Su, Ming-Der, An ab Initio MO Study of the Thermal Decomposition of Chlorinated Monosilanes, $SiH_n-4Cl_n$ (n=0-4), J. Phys. Chem. 1993, vol. 97, pp. 9981-9985.

Walker, K. L. Jardine, Mechanisms and Kinetics of the Thermal Decompositions of Trichlorosilane, Dichlorosilane, and Monochlorosilane, International Journal of Chemical Kinertics, 1998, vol. 30, p. 69.

Swihart, Mark T., On The Mechanism of Homogeneous Decomposition of the Chlorinated Silanes. Chain Reactions Propogated by Divalent Silicon Species, J. Phys. Chem. A 1998, vol. 102, pp. 1542-1549.

Walch, Stephen, Thermal Decomposition Pathways and Rates for Silane, Chlorosilane, Dichlorosilane, and Trichlorosilane, J. Phys. Chem. A., vol. 105, pp. 2015-2022.

Nitodas, Stephanos F., Mathematical Modeling of the Gas-Phase Chemistry in the Decomposition of Chlorosilanes in Mixtures of Carbon Dioxide and Hydrogen at High Temperatures, Journal of the Electrochemical Society vol. 149 (2), pp. C112-C119, 2002.

Vaughan, Stephen, Nitric Oxide and Nitrogen Dioxide Gas Standards, Gases and Instrumentation, Nov./Dec. 2007.

Guangquan, Lu, Contamination Control for Gas Delivery from a Liquid Source in Semiconductor Manufacturing, IEEE Transactions on Semiconductor Manufacturing, vol. 10(4), pp. 425-432, 1997.

US 6,202,885, 03/2001, Zdunek et al. (withdrawn)

* cited by examiner

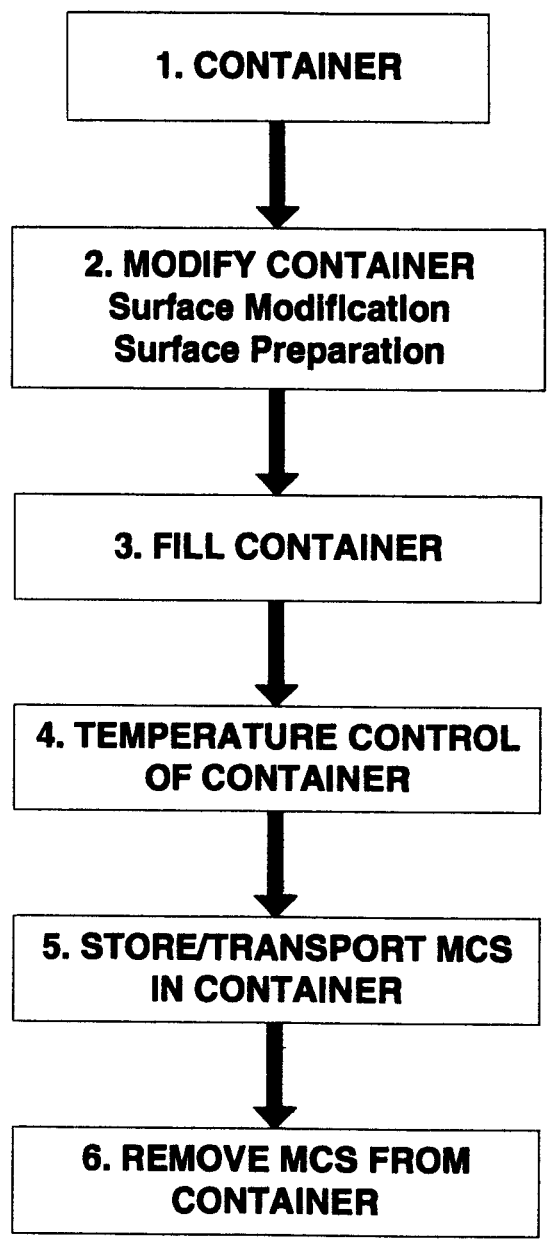

CYLINDER SURFACE TREATED CONTAINER FOR MONOCHLOROSILANE

CROSS REFERENCE TO RELATED APPLICATIONS

The present patent application claims the benefit of prior U.S. Provisional Patent Application Ser. No. 61/353,870 filed Jun. 11, 2010.

BACKGROUND OF THE INVENTION

Monochlorosilane (formula $ClSiH_3$, henceforth MCS) has been identified as a promising precursor to low temperature silicon nitride film deposition in microchip fabrication.

MCS is stored in sealed containers as a liquid under its own vapor pressure (74 psig at 68° F., 612 kPa at 20° C.). Steel containers are used to contain the vapor pressure of the MCS and are required by code for its transportation.

High quality silicon nitride film deposition processes require precursors having consistently high purity. However, MCS has been found to decompose rapidly to dichlorosilane (formula $H_2SiCl_2$, henceforth DCS) and monosilane (henceforth $SiH_4$) in the metal containers at ambient temperature (20° C.). Decomposition products represent "impurities" in the MCS. DCS present in trace amounts is particularly deleterious in the nitride film deposition process. Furthermore, variation in the DCS content of MCS delivered from storage containers adversely affects the deposition process stability. The amount of impurities in MCS extracted from the container can vary significantly over time. This variation results from a combination of MCS decomposition and vapor/liquid phase partitioning of the impurities. The amount of impurities in the container at a given time is determined by the decomposition rate and the storage time.

Extraction of MCS from the container typically occurs from the vapor phase at the top of the container. However, due to the disparate boiling points of MCS and impurities in the mixture, lower boiling point compounds, such as MCS and $SiH_4$ impurity, tend to predominate in the extracted vapor, while higher boiling point compounds, such as DCS, are preferentially partitioned to the liquid phase.

As a result, DCS becomes concentrated in the container's "liquid heel" over time. DCS levels in the extracted vapor therefore rise as MCS is removed from the container causing a variation in MCS purity. Since high consistency in MCS purity is required for deposition of quality nitride thin films, it is important to minimize the rate of MCS decomposition during storage. This in turn minimizes the increase in DCS levels during MCS extraction from the container.

Prior art in the general field of the present invention includes:
US 2003/0068434;
U.S. Pat. No. 5,009,963;
U.S. Pat. No. 5,480,677;
U.S. Pat. No. 5,259,935;
U.S. Pat. No. 5,479,727;
U.S. Pat. No. 2,900,225;
U.S. Pat. No. 3,968,199;
Su, Ming-Der and Schlegel, Bernhard "An ab Initio MO Study of the Thermal Decomposition of Chlorinated Monosilanes, $SiH_{4-n}Cl_n$ (n=0-4)", *J. Phys. Chem.* 1993, 97, 9981-9985;
Walker, K. L., Jardine, R. E., Ring, M. A. and O'Neal, H. E., "Mechanisms and Kinetics of the Thermal Decompositions of Trichlorosilane, Dichlorosilane, and Monochlorosilane", *Int. J. Chem. Kinet* 1998, 30, 69;
Swihart, Mark T. and Carr, Robert W., "On the Mechanism of Homogeneous Decomposition of the Chlorinated Silanes. Chain Reactions Propagated by Divalent Silicon Species", *J. Phys. Chem. A* 1998, 102, 1542-1549;
Walch, Stephen and Dateo, Christopher, "Thermal Decomposition Pathways and Rates for Silane, Chlorosilane, Dichlorosilane, and Trichlorosilane", *J. Phys. Chem. A* 2001, 105, 2015-2022;
Nitodas, Stephanos F. and Scotirchos, Stratis V., "Methematical Modeling of the Gas-Phase Chemistry in the Decomposition of Chlorosilanes in Mixtures of Carbon Dioxide and Hydrogen at High Temperatures", *J. Electrochem. Soc.*, 149 (2) C112-C119 (2002);
Vaughan, Stephen, "Nitric Oxide and Nitrogen Dioxide Gas Standards", *Gases and Instrumentation*, November/December, 2007;
Guangquan Lu, Rubloff, G. W. and Durham, J. "Contamination Control for Gas Delivery from a Liquid Source in Semiconductor Manufacturing", *IEEE Transactions on Semiconductor Manufacturing*, 10(4), 425-432, (1997);

BRIEF SUMMARY OF THE INVENTION

The present invention is a container having an internal surface modification capable of containing monochlorosilane in a stable condition where the internal surface is selected from the group consisting of;
 (a) a surface resulting from mechanical polishing;
 (b) a surface resulting from electropolishing;
 (c) a surface resulting from formation of a hydrophobic protecting layer of organic molecules;
 (d) a surface resulting from providing an internal surface of stainless steel;
 (e) a surface resulting from providing an internal surface of aluminum;
 (f) a surface resulting from providing an internal surface of nickel;
 (g) a surface resulting from a polymer coating;
 (h) a surface having a silicon oxide coating;
 (i) a surface having a crystalline carbon layer molecularly bonded to the metal
 (j) a surface having a passivation layer of a metal fluoride;
 (k) a surface having a passivation layer of silane bonded to metal by exposure to silanes;
 (l) a surface having de-activating hydroxyl groups; and, containing a volume of monochlorosilane.

The present invention is also a method of preparing a container for storing monochlorosilane in a stable manor, comprising;
 (A) Providing a container of metal having an inlet and an outlet, wherein the inlet and outlet can be a single orifice;
 (B) Treating an internal surface of the container to a process selected from the group consisting of;
  (a) mechanical polishing the internal surface with particulate abrasive;
  (b) electropolishing the internal surface;
  (c) formation of a hydrophobic protecting layer of organic molecules by silylation;
  (d) providing an internal surface of stainless steel;
  (e) providing an internal surface of aluminum;
  (f) from providing an internal surface of nickel;
  (g) coating the internal surface with a polymer coating;
  (h) coating the internal surface with a silicon oxide coating;
  (i) coating the internal surface with a crystalline carbon layer molecularly bonded to the metal;

(j) passivating the internal surface with a layer of a metal fluoride by contact of the internal surface with a passivating fluid containing fluorine;
(k) passivating the internal surface with a layer of silane bonded to metal by exposure to silanes;
(l) passivating the internal surface by de-activating hydroxyl groups on the internal surface;
(m) maintaining the container and the monochlorosilane at a temperature no greater than 20° C. and, combinations of (a) through (m).

BRIEF DESCRIPTION OF THE FIGURE

The FIGURE is a flow diagram of an embodiment of the present invention.

DETAILED DESCRIPTION OF THE INVENTION

Pure (>99.5%) monochlorosilane (MCS, $ClSiH_3$) has been identified as a promising precursor to low temperature silicon nitride thin film deposition. However, MCS decomposes during steel container storage at a rate exceeding that of other chlorosilanes. Such decomposition contributes to high variability in MCS purity during use.

For example, typical decomposition rates at 20° C. reduce MCS content in a 44 liter steel container by about 10% per month. One reaction product (dichlorosilane, DCS, $H_2SiCl_2$) is particularly deleterious to the film deposition process.

Reaction modeling reveals that the rate of MCS disproportionation to DCS and silane ($SiH_4$) is not significant in the gas phase, but rather proceeds at room temperature only from catalytic reactions at the ferrous metal surface. This reaction mechanism is unique to MCS vis-à-vis $SiH_4$ and other chlorosilanes, which may be successfully stored with retention of purity in steel vessels.

Various container surface modifications have been identified to reduce surface reactions to acceptable levels. Such modifications include various combinations of: reduced surface roughness through mechanical polishing and/or electropolishing; alteration of surface composition from carbon steel to stainless steel; silylation with, for example, trimethylchlorosilane (chlorotrimethylsilane, CTMS) and/or hexamethydisilazane (HMDS) to deactivate surface OH groups; surface coating with polymers such as ethylene tetrafluoroethylene (ETFE), epoxy resins, phenolic resins, polyarylene ether (PAE) or paralene; surface coating with, for example, nickel, diamond-like carbon or silicon oxide via electroplating, electroless plating or chemical vapor deposition (e.g., chemical vapor deposition (CVD), plasma enhanced chemical vapor deposition (PECVD), atomic layer deposition (ALD)); minimization of surface exposure to water during cylinder preparation using substitute rinse liquids, such as 2-propanol, and surface passivation with DCS, silane or fluorine. The most successful combinations of surface modifications have been found to reduce decomposition rate by over two orders of magnitude, thereby permitting storage and transport of high purity MCS to end users.

The mechanisms of chlorosilane decompositions are not well understood. It is known that MCS decomposes at a much higher rate than $SiH_4$ and the higher chlorosilanes, i.e. DCS and trichlorosilane (formula $Cl_3SiH$, henceforth TCS). The decomposition rates of MCS at 20° C. and 0° C. differ enough so that the activation energy $E_a$ for decomposition can be estimated to be 22 kcal/mole (82 kJ/mole) by fitting the rate constants to the Arrhenius equation. The decomposition mechanisms are divided into those proceeding via the well known silylene intermediate involved in high temperature (i.e. >450° C.) gas-phase and silicon surface decomposition reactions, and those proceeding via surface catalyzed reactions that can occur at significant rates at or near ambient temperature.

Silylene Intermediate Decomposition Mechanism

Silylene intermediate decomposition pathways for chlorosilanes have been investigated by others through molecular orbital (MO) calculations and experimental testing. MCS decomposition to DCS and TCS products was predicted and observed. In those investigations silylene intermediates were assumed to form in the primary decomposition reactions. These reactions were believed to include formation of intermediates on the quartz reactor wall. Decomposition in quartz reactors was typically observed only at temperatures significantly above ambient temperature (20° C.). Indeed the reported activation energies (typically of the order 68 kcal/mole, calculated from observed reaction rates) were high enough that the process is highly unlikely to proceed at room temperature. For example, calculations from the Arrhenius equation predict a half life for these reactions of $4.8 \times 10^{30}$ days at 25° C. Furthermore, reaction product DCS is not observed during decomposition of MCS in steel containers, as it was in quartz reactors. Therefore, such silylene intermediate mechanisms are not likely to be important for the observed rapid decomposition process in steel containers near ambient temperature.

Surface Catalyzed Mechanism

The mechanism of MCS decomposition during storage in a steel container differs from that of $SiH_4$ and other chlorosilanes such as DCS and TCS. The other chlorosilanes [i.e. DCS, TCS and silicon tetrachloride (STC)] are well known to be stable when stored and transported in steel or stainless steel containers with retention of high purity.

$SiH_4$ can decompose to form hydrogen ($H_2$) plus a mixture of higher silane oligomers [e.g. disilane ($Si_2H_6$), trisilane ($Si_3H_8$), etc.] when exposed to the surface of a metallic container. This $SiH_4$ reaction is self limiting, however, since the polysilane oligomers eventually form a protective film covering the reactive sites on the surface. In contrast, MCS decomposition principally comprises a disproportionation (also known as dismutation) into $SiH_4$ and DCS via a surface catalyzed reaction. The disproportionation of MCS to $SiH_4$ and DCS can be greatly accelerated by the catalysis of Lewis acids (e.g. $AlCl_3$) or by bases, such as tertiary amines or basic macroreticular polymers. (Such catalytic processes are routinely used to synthesize $SiH_4$ for commercial use.) Lewis acids and bases decrease MCS stability.

When "carbon steel", commonly known as chromoly or CRMO low-alloy steels, containing less than 1.1% of Cr and Mo, each, as the principal alloying metals in a predominantly iron matrix (in the 41xx family of steels), is used as the container material, the following reactions are theorized to occur on the oxidized surface:

Both $FeCl_2$ and $FeCl_3$ are very effective Lewis acid catalysts. On a polished steel surface lacking oxides of iron, the generation of ferrous chloride and ferric chloride is theorized to require the involvement of moisture and/or oxygen as follows:

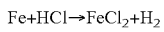

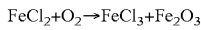

Absent moisture and oxygen, a trace amount of HCl impurity in MCS may also form the catalyst iron chloride. In some cases, trace HCl impurity is present in MCS as a byproduct of the MCS synthesis process.

It is further theorized that the Lewis acid catalyst may pass through the following type of intermediate complex, which results in the exchange of H and Cl between two MCS molecules upon the dissociation from the metal center.

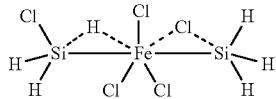

Or, in a stepwise mechanism:

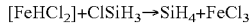

The calculated activation energy for the above reaction chain is 25 kcal/mole. This is close to the measured value of 22 kcal/mole, and indicates a reaction pathway likely to proceed at ambient temperature (20° C.).

The disproportionation of DCS proceeds as follows:

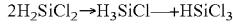

The greater the number of chlorine atoms bound to the silicon, the greater the stability of the molecule, and the lower the probability of disproportionation. This phenomenon can be explained by a combination of several factors, such as the steric effect of the substituents, molecular polarity (dipole moment), electron density distribution, etc.

The observed high decomposition rate of MCS in carbon steel containers is thus recognized as a unique problem requiring interaction of the MCS with the ferrous metal surface. It is unlike the other chlorosilanes, which don't undergo significant decomposition in steel containers that have been cleaned and prepared in accordance with the common practice for such containers. Further, unlike $SiH_4$, MCS decomposes by disproportionation in steel containers, and this reaction is not intrinsically self-limiting by forming an oligomeric surface coating. Correction of this problem requires recognition of this reaction mechanism and a suitable means to break the reaction chain.

Experimental data indicate that the process of MCS decomposition during storage is a strong function of the container's internal surface condition. Variation in parameters, such as container vendor, container surface composition, (carbon steel versus stainless steel, or polymer, silicon oxide or nickel coatings, etc.), surface chemistry (presence of iron oxides, iron chlorides, hydroxyl or OH groups, etc.), surface area (surface roughness, surface to volume ratio through container size and geometry), exposed grain boundaries, container preparation method (acid and DI water wash, and hot $N_2$ drying, etc.), container history, prior use, etc., have a significant effect on MCS decomposition rate. (Other parameters that affect the decomposition rate, include; the presence of trace impurities, such as; HCl, $H_2O$, $O_2$, etc., in the MCS, and ambient temperature.)

MCS decomposition rate can, therefore, be minimized by control of the container surface condition. Material selection, surface treatment and surface preparation are the primary means of controlling the surface condition. For example, modifications to the surface that de-activate hydroxyl groups or eliminate the above catalytic reaction chain tend to reduce MCS decomposition rate.

Generally, secondary treatment regimens for the stabilization of these materials vary with the company manufacturing the mixture. Passivation regimens available and currently in use include a number of different cylinder acid washes, abrasive polishing techniques, non-reactive metal coating (such as nickel), polymer coatings, deactivation techniques borrowed from the gas chromatography column conditioning industry, anodizing, and simple cylinder pretreatment with the component of interest (i.e., pickling). Such control methods uniquely affect MCS decomposition vis-à-vis other materials, including other chlorosilanes or silicon hydrides.

The present invention consists of modification of the internal surface of the MCS container using one or a combination of the following methods:

(a) The roughness of the container's internal surface is reduced through a process of mechanical polishing. Such polishing may be performed using shot blasting, glass bead blasting, or preferably abrasive slurry polishing. The abrasive slurry may consist of stainless steel or ceramic spheres, saturn shaped pellets or other shaped objects in a corrosion inhibiting liquid, such as one of the Chemtrol® family of liquids available from Precision Finishing Inc. In one embodiment of the polishing process shot blasting may be performed three times followed by abrasive slurry polishing with ceramic pellets followed by abrasive slurry polishing with stainless steel shaped pellets in a multi-step process. The corrosion inhibiting liquid is left on the internal surface of the container until subsequent container preparation steps are performed. Abrasive slurry treatment cold works the steel surface to reduce macro-roughness and provide an approximately 1 micron $R_a$ surface finish. Such polishing reduces the overall surface area available for MCS decomposition and burnishes away localized reaction sites, such as; surface asperities and grain boundary discontinuities. In addition to burnishing, such polishing treatment also imparts a less reactive surface by virtue of incorporation of inert impurities and/or compressive stress in the near surface area.

(b) The roughness and surface composition of the container's internal surface is modified through a process of electropolishing. Electropolishing tends to produce lower carbon content in a steel surface. Without other prior steps, such as mechanical polishing, electropolishing reduces the steel surface micro-roughness to provide an approximately 2.6 micron $R_a$ surface finish: Such polishing reduces the overall surface area available for MCS decomposition. When electropolishing is preceded by mechanical polishing, the $R_a$ surface roughness may reach the low value of approximately 0.2 micron.

(c) Based on the above decomposition mechanisms, MCS decomposition rate can be reduced through the formation of a hydrophobic protecting layer of organic molecules to block the contact of MCS or HCl with steel. This effect can be obtained through a silylating surface treatment with certain monochloro-organic silanes, such as; dimethylchlorosilane, trimethylchlorosilane (chlorotrimethylsilane, CTMS) and hexamethydisilazane (HMDS). Other organochlorosilanes, such as; octadecyltrichlorosilane and the like are also useful to impart a strongly hydrophobic surface.

(d) The material composition of the container's internal surface is changed from "carbon steel" to stainless steel, aluminum or nickel. This may be accomplished by manufacturing the container from stainless steel, aluminum or nickel tube, or shaping stainless steel, aluminum or nickel sheet into a container, or using a welded stainless steel or aluminum vessel. An internally clad stainless steel, aluminum or nickel container with the pressure envelope enhanced by the use of a secondary outer sheath may also be used. Such sheaths, include; carbon- aramid- or glass-fiber wrapping, to produce a composite container. Clad containers may also be fabricated by explosion bonding dissimilar metal sheets, prior to forming them into a container. Also, internally clad pipe made by co-extrusion may be formed into a suitable pressure vessel, that is suitable for containing MCS under pressure.

(e) The internal surface of the container is coated with a polymer, such as; poly(ethylene-co-tetrafluoroethylene (ETFE, e.g. Tefzel®), epoxy resin, phenolic resin, polyarylene ether (PAE) or poly(paraxylene) (e.g., paralene). Such internal coatings may be applied as: a solvent-borne solution or dispersion of polymer, by rotomolding of powdered polymer, by chemical vapor deposition, and by other methods well known in the art. An optional bonding layer to improve adhesion to the internal container surface may be employed. Such polymers form a physical barrier between the MCS and the steel surface. Polymers having active hydroxyl groups are subsequently de-activated through a silylating surface treatment as described above.

(f) The internal surface of the container is changed in composition by coating with a non-ferrous metal, such as nickel. The nickel may be applied through an electroless coating process or through an electroplating process. The coating can be substantively pure metal or can be an alloy with other metals or metalloids. For example, a preferred embodiment includes, electroless deposition of NiP amorphophous alloy. This material change eliminates the presence of iron oxides and iron chlorides, that contribute to MCS decomposition.

(g) The internal surface of the container is coated through a chemical vapor deposition (CVD) process to produce a silicon oxide or diamond-like carbon layer molecularly bonded to the metal. This process may consist of the Silkonert® treatment provided by SilcoTek, and is a high temperature silicon oxide deposition process normally applied to heat resistant steels, such as stainless steel. The metal to silicon bonding process may be followed by a surface passivation process using any of the chlorosilanes. Alternative deposition processes include plasma-enhanced chemical vapor deposition (PECVD) and atomic layer deposition (ALD), all well known in the art of film deposition.

(h) The internal surface of the container is passivated using fluorine ($F_2$) to produce a metal fluoride layer. $F_2$ is applied to the steel surface in a dilute mixture, such as 5%, in an inert gas such as nitrogen ($N_2$). The fluorination process is applied at ambient temperature for a selected period of time.

(i) The internal surface of the container is "pickled" or passivated by exposure to chlorosilanes or silicon hydrides, such as; $SiH_4$, MCS or DCS. The exposure preferably occurs at an elevated temperature, such as 55° C., for a selected period, such as one month. Such treatment has the beneficial effect of de-activating hydroxyl groups on the container surface, and in the case of $SiH_4$ passivation, providing a surface film as described above that is non-reactive to MCS.

The invention further consists of a surface preparation step performed either before or after the above surface modification steps as follows:

The internal surface of the container is rinsed multiple times using a non-aqueous liquid, such as isopropyl alcohol (IPA), held at ambient temperature, following by drying of the container using a purge with an inert gas, such as $N_2$, and held at an elevated temperature for a selected period of time. Preferably, three IPA rinses are performed on the container. The container is then capped or valved to minimize further exposure to ambient moisture or other impurities.

Such improvements reduce MCS decomposition rates in 44 liter containers to <0.1% per month at ambient temperature (20° C.), an improvement of over two orders of magnitude.

The invention further consists of maintaining the filled container at a temperature near or below 20° C. during storage of the MCS. Preferably the container is maintained at 0° C. through well known refrigeration methods. Low temperature storage is combined with the surface modification, and surface preparation steps described above to minimize decomposition of MCS during storage. Such reduced temperature T storage reduces the reaction rate of the MCS decomposition process in a manner described by the Arrhenius reaction rate equation:

$$k=A \exp\{-E_a/RT\}$$

where "k" is the reaction rate constant, "A" is the pre-exponential factor determined by reaction kinetics, and "R" is the universal gas constant. A reduction in storage temperature to <10° C. can further reduce the decomposition rate in a 44 liter container to <0.01% per month, a total improvement of over three orders of magnitude.

The invention therefore comprises the steps depicted in the FIGURE, as follows:

The MCS container 1 is modified using one or more processes 2 including surface modification and/or surface preparation, followed by 3 filling of the container with MCS, and/or followed by 4 temperature control of the container during 5 storage and transport of the MCS in the container, followed by 6 removal of the stable and high purity MCS from the container.

The surface modifications, surface preparation steps and temperature changes described in this invention are not limited to storage containers, and may apply to any other surfaces contacting MCS during its useful life, including but not limited; to reactor vessels, transfer lines, deposition chambers, various in-line components, such as valves, flow meters, pressure sensors, and the like. Such application of this invention further maintains the MCS purity and improves the MCS stability from its point of synthesis to its location of use, and if applicable its recovery and re-use.

Example 1

Ten carbon steel gas containers were used to store MCS at an ambient temperature of approximately 20° C. The containers had an internal volume of 44 liters. Both liquid and vapor phase MCS was stored in all the containers. The containers had no modifications to internal surface condition or surface preparation method of the types described for this invention. The period of MCS storage among the containers ranged from 6 days to 80 days. Vapor phase MCS purity was measured from each container using a gas chromatograph equipped with a thermal conductivity detector. Measurements were taken at the beginning of the storage periods and at various times during the storage process for each container.

The average measured rate of loss for the MCS among all the containers due to decomposition was 7.2% per month. This MCS was converted to reaction products $SiH_4$ and DCS. This represents the approximate baseline rate of decomposition for containers not having the benefits of this invention.

Two other carbon steel containers were used to store MCS at the same ambient temperature of approximately 20° C. These containers also had an internal volume of 44 liters. Both liquid and vapor phase MCS was stored in the containers. These two containers had their internal surfaces mechanically polished using slurry, including a corrosion inhibiting agent according to the method of this invention prior to MCS storage. The period of storage among the containers was 37 days and 15 days. Vapor phase MCS purity was measured from each container using a gas chromatograph equipped with a thermal conductivity detector. Measurements were taken at the beginning of the storage periods and at various times during the storage process for each container. The measured rates of loss of MCS for the two containers due to decomposition were 0.025% per month and 0% per month, respectively.

Example 2

Two carbon steel containers were used to store MCS at the same ambient temperature of approximately 20° C. These containers also had an internal volume of 44 liters. Both liquid and vapor phase MCS was stored in the containers. These two containers had their internal surfaces mechanically polished using abrasive slurry, including a corrosion inhibiting agent according to the method of this invention and then had their internal surfaces silylated with CTMS according to the method of this invention prior to MCS storage. The period of MCS storage was 15 days for each container. Vapor phase MCS purity was measured from each container using a gas chromatograph equipped with a thermal conductivity detector. Measurements were taken at the beginning of the storage periods and at various times during the storage process for each container. The measured rates of loss of MCS for the two containers due to decomposition were 0% per month for both containers.

Example 3

A carbon steel container was used to store MCS at the same ambient temperature of approximately 20° C. This container also had an internal volume of 44 liters. Both liquid and vapor phase MCS was stored in the container. This container had its internal surface coated with nickel using the electroless coating method of this invention, and then had its internal surface silylated according to the method of this invention prior to MCS storage. The period of MCS storage was 40 days. Vapor phase MCS purity was measured from the container using a gas chromatograph equipped with a thermal conductivity detector. Measurements were taken at the beginning of the storage period and at various times during the storage process for the container. The measured rate of loss of MCS for the container due to decomposition was 0% per month.

Example 4

Nineteen carbon steel containers were used to store MCS. These containers had no modifications to internal surface condition or surface preparation method of the types described for this invention, but were maintained at a lowered ambient temperature of approximately 0° C. These containers also had an internal volume of 44 liters. Both liquid and vapor phase MCS was stored in the containers. The period of MCS storage among the containers ranged from 18 days to 53 days. Vapor phase MCS purity was measured from each container using a gas chromatograph equipped with a thermal conductivity detector. Measurements were taken at the beginning of the storage periods and at various times during the storage process for each container. The average measured rate of loss of MCS among all the containers due to decomposition was 0.44% per month.

Example 5

A carbon steel gas container was used to store MCS at an ambient temperature of approximately 20° C. This small container was of the type commonly referred to as a "lecture bottle". In this test, only vapor phase MCS was stored in the lecture bottle. The lecture bottle had no modifications to internal surface condition or surface preparation method of the types described for this invention. The period of MCS storage for the lecture bottle was 31 days. Vapor phase MCS purity was measured from the lecture bottle using a gas chromatograph equipped with a thermal conductivity detector. Measurements were taken at the beginning of the storage period and at various times during the storage process. The measured rate of loss for the MCS for the lecture bottle due to decomposition was 20% per month. This MCS was converted to reaction products $SiH_4$ and DCS. This represents the approximate baseline rate of decomposition for lecture bottles not having the benefits of this invention.

A different carbon steel lecture bottle was used to store MCS at the same ambient temperature of approximately 20° C. This lecture bottle had its internal surface coated with silicon oxide using the Silconert® CVD process, according to this invention prior to MCS storage. The period of MCS storage for this coated lecture bottle was 45 days. Vapor phase MCS purity was measured from the coated lecture bottle using a gas chromatograph equipped with a thermal conductivity detector. Measurements were taken at the beginning of the storage period and at various times during the storage process. The measured rate of loss of MCS for the coated lecture bottle due to decomposition was 0.6% per month.

Example 6

A stainless steel gas container was used to store MCS at an ambient temperature of approximately 20° C. The container had an internal volume of 3.8 liters. Both liquid and vapor phase MCS were stored in the container. The container had its internal surface polished using an abrasive slurry, electropoloshed and coated with silicon oxide using the Silconert® CVD process, according to this invention, prior to MCS storage. The period of MCS storage for the lecture bottle was 50 days. Vapor phase MCS purity was measured from the container using a gas chromatograph equipped with a thermal conductivity detector. Measurements were taken at the beginning of the storage period and at various times during the storage process. The measured rate of loss of MCS for the container due to decomposition was 0.015% per month.

Example 7

Three stainless steel gas containers were used to store MCS at an ambient temperature of approximately 20° C. The containers had an internal volume of 3.8 liters. Both liquid and vapor phase MCS were stored in the containers. The containers had their internal surfaces polished using an abrasive slurry and electropoloshed, according to this invention, prior to MCS storage. The average period of MCS storage for the containers was 52 days. Vapor phase MCS purity was measured from the containers using a gas chromatograph equipped with a thermal conductivity detector. Measurements were taken at the beginning of the storage period and at various times during the storage process. The average measured rate of loss of MCS for the containers due to decomposition was 0.045% per month.

Example 8

A stainless steel gas container was used to store MCS at an ambient temperature of approximately 20° C. The container had an internal volume of 3.8 liters. Both liquid and vapor phase MCS was stored in the container. The container had its internal surface polished using an abrasive slurry, electropoloshed and silylated with CTMS, according to this invention, prior to MCS storage. The period of MCS storage for the container was 53 days. Vapor phase MCS purity was measured from the container using a gas chromatograph equipped with a thermal conductivity detector.

Measurements were taken at the beginning of the storage period and at various times during the storage process. The measured rate of loss of MCS for the container due to decomposition was 0.045% per month.

The invention claimed is:

1. A container containing a volume of monochlorosilane having an internal surface, wherein the internal surface comprises either carbon steel or stainless steel and has been modified by mechanical polishing followed by exposure to either a silicon hydride or a chlorosilane prior to storage of the monochlorosilane, wherein the container is capable of stably storing monochlorosilane such that the rate of decomposition of monochlorosilane is less than 0.1% per month at ambient temperature.

2. The container of claim 1 wherein the mechanical polishing was performed by a process selected from the group consisting of shot blasting, glass bead blasting, and abrasive slurry polishing.

3. The container of claim 2 wherein the mechanical polishing was performed by an abrasive slurry.

4. The container of claim 3 wherein the abrasive slurry comprises stainless steel or ceramic spheres.

5. The container of claim 3 wherein the abrasive slurry comprises a corrosion inhibitor.

6. The container of claim 2 wherein the mechanical polishing was accomplished by shot blasting the surface three times followed by abrasive slurry polishing with ceramic pellets followed by abrasive slurry polishing with stainless steel shaped pellets.

7. The container of claim 2 wherein the mechanical polishing provides approximately a 1 micron $R_a$ surface finish.

8. The container of claim 1 wherein the silicon hydride is MCS or DCS.

9. The container of claim 1 wherein the container is a 44 liter container.

10. The container of claim 1 wherein the container, once filled with the monochlorosilane, is maintained at a temperature of below 20° C. during storage.

11. The container of claim 10 herein the container, once filled with the monochlorosilane, is maintained at a temperature of 0° C.

12. The container of claim 1 wherein the monochlorosilane has a purity of greater that 99.5%.

13. The container of claim 1 wherein the de-activation of surface hydroxyl groups by exposure to either a silicon hydride or chlorosilane occurs at an elevated temperature.

14. The container of claim 13 wherein the elevated temperature is 55° C.

15. The container of claim 1 wherein the exposure to either a silicon hydride or a chlorosilane prior to storage of the monochlorosilane de-activates surface hydroxyl groups.

* * * * *